United States Patent [19]
Nakakawaji et al.

[11] Patent Number: 5,346,633
[45] Date of Patent: Sep. 13, 1994

[54] METHOD FOR SURFACE TREATMENT OF A BODY, SURFACE TREATMENT AGENT, SURFACE TREATED BODY, SURFACE TREATED MEMBERS, AND APPARATUS BEING FURNISHED WITH SAME

[75] Inventors: Takayuki Nakakawaji, Hitachi; Atsushi Morihara, Katsuta; Mitsuyoshi Shoji, Juo; Koji Sato, Hitachi; Yutaka Ito, Takahagi; Ryuichi Kaji, Kitaibaraki; Hiroshi Go, Zama, all of Japan

[73] Assignee: Hitachi, Ltd., Tokyo, Japan

[21] Appl. No.: 852,704

[22] Filed: Mar. 17, 1992

[30] Foreign Application Priority Data

Mar. 19, 1991 [JP] Japan .................. 3-054342

[51] Int. Cl.$^5$ .......................... C10M 147/04
[52] U.S. Cl. .......................... 252/10; 252/11; 252/12; 252/54; 252/12.2
[58] Field of Search .............. 252/10, 11, 12

[56] References Cited

U.S. PATENT DOCUMENTS

| | | | |
|---|---|---|---|
| 3,775,317 | 11/1973 | Inami et al. | 252/11 |
| 3,928,214 | 12/1975 | Naka et al. | 252/11 |
| 3,944,610 | 3/1976 | Caporiccio et al. | 260/561 HL |
| 3,950,588 | 4/1976 | McDougal | 428/288 |
| 4,823,234 | 4/1989 | Konishi et al. | 361/395 |
| 4,866,571 | 9/1989 | Butt | 361/386 |
| 5,156,756 | 10/1992 | Kojima et al. | 252/11 |
| 5,164,885 | 11/1992 | Drye et al. | 361/387 |
| 5,220,487 | 6/1993 | Patel et al. | 361/386 |

FOREIGN PATENT DOCUMENTS

| | | |
|---|---|---|
| 0207282 | 1/1987 | European Pat. Off. . |
| 0339583 | 11/1989 | European Pat. Off. . |
| 0361346 | 4/1990 | European Pat. Off. . |
| 59-012708 | 1/1984 | Japan . |
| 60-190748 | 9/1985 | Japan . |

Primary Examiner—Ellen M. McAvoy
Attorney, Agent, or Firm—Antonelli, Terry, Stout & Kraus

[57] ABSTRACT

Object of the present invention is to provide an apparatus in which water, oil or grease are maintained on an ordinary using surface in a stable condition by preventing the water, the oil or the grease from moving to other surface than the ordinary using surface.

The present invention relates to an apparatus using water, oil, or grease, especially, the apparatus in which surroundings of the surface maintaining the water, the oil, or the grease are reformed by fluorinated compound. In accordance with the present invention, seeping out of the water, the oil, or the grease are prevented, the water, the oil, or the grease are certainly held at the using surface, and stable performance is maintained for a long time.

9 Claims, 4 Drawing Sheets

FIG. 1
PRESENT INVENTION

METHOD FOR SURFACE TREATMENT OF A BODY, SURFACE TREATMENT AGENT, SURFACE TREATED BODY, SURFACE TREATED MEMBERS, AND APPARATUS BEING FURNISHED WITH SAME

BACKGROUND OF THE INVENTION (1) Fields of Industrial Utilization

The present invention relates to a method of surface treatment of members used with water and/or oil, and grease etc., surface treatment agents, surface treated members, surface treated bodies, and apparatus mounted with same.

(2) Description of the Prior Art

Water, oil, and grease are used in many products. One of the objects using water is cooling. As concrete products, there are a radiator of a car, and a water cooled type large scale computer etc. But, there are many members which will cause troubles with water around water cooled portion of the above described products, and when water leaks from the water cooled portion, there is a possibility to cause a serious damage. And, using objects of oil and grease spread to various field such as lubrication, sealing, and corrosion protection etc. Concretely saying, lubrication of a bearing, heat conductor for cooling of heat generated in an apparatus, and sealing material such as packing etc. can be enumerated. Oil and grease are indispensable for a bearing as a lubricant. On the other hand, as water, oil, and grease seep out from the bearing after using for a long time, sufficient water, oil, and grease are not supplied to the rubbing portion, and consequently, sticking is caused and stable driving becomes impossible. Accordingly, periodic supply of lubricants and prevention of seeping out by use of packing are performing. It is present status that reliability of water, oil and greases used as a heat conductor for cooling of heat generated in an apparatus for a long time is not realized yet because of seeping out.

Especially, current electronic apparatus are rapidly developed in down sizing, decreasing weight, high densification, and speed up of response. Accordingly, miniaturizing and high performance of each members composing electronic apparatus are required. Among the electronic apparatus, there are many apparatus which are furnished with members using water, oil and grease, and the members remarkably contribute to the reliability of the apparatus. On the other hand, there are many fine members which cause operation impossibleness and failure when the members are contaminated with dust and insulating material and deficiency of oil at a rotation system and a rubbing portion are generated, and there is a possibility that seeping out and diffusion of water, oil and grease may cause a remarkable damage to the fine members. Actually, various kind of failures such as insulation deficiency and operation impossibleness etc. are induced by leakage and seeping out of grease into other members than the ordinary using members.

A case of a large scale computer as an example of electronic apparatus, thermal flux in the device for the large scale computer is increased in accordance with higher integration. Accordingly, a cooling system having high performance corresponding to the computer with increased heat generation and low cost corresponding to general computers is required.

For realizing the high performance and the low cost, using of grease for heat transfer between cooling portions of the two devices is inevitable at the present.

Correspondingly, a method for cooling a chip effectively by preferable heat transferring between the chip and a cooling portion is proposed.

A cooling element for heat transferring from an integrated circuit or a chip and cooling portion disclosed in JP-B-56-22380 (1981) is the cooling element composed of a block on a cylinder having a curved surface on a semisphere, a housing having similar shaped holes, and an elastic body for binding the block and the housing.

Further, in order to improve heat transfer at contacting boundaries of the cooling element, using of grease to electronic apparatus and integrated circuits are proposed.

In the reference FUJITSU vol. 41, No. 1 pp. 12–19 (1990), grease was used between a chip and a cooling apparatus in order to realize preferable heat transfer at the contacting boundary.

As for issues in using grease, of course, not only superior heat conductivity but also prevention of oil seeping out are important in view of reliability for a long time.

That means, in order to use water, oil, and grease in a stable condition for a long time, certain sealing to the using portion is an extremely important technology.

Correspondingly, methods for surface modification by material containing mainly fluorine as a technique to protect surface of a base plate from water, oil, and grease, and to improve removal of oil and water are proposed. Methods for preventing water, oil, and grease from contaminating surface of bodies by applying fluorine group resin are disclosed in JP-A-63-120789 (1988), JP-A-1-304936 (1989), JP-A-60-31535 (1985), and JP-A-60-259837 (1985). On the other hand, methods for surface modification by fluorinated surfactant and silane coupling agents are disclosed in JP-A-60-190727 (1985), JP-A-62-253045 (1987), JP-A-59-30848 (1984), JP-A-63-35681 (1988). Further, a method for preventing seeping out of grease to the optical lenses by applying a seeping out prohibiting agent containing fluorinated surfactant as a main component is disclosed in JP-A-59-126109 (1984).

The above described prior arts disclosed in JP-A-63-120789 (1988), JP-A-1-304936 (1989), JP-A-60-31535 (1985), JP-A-60-259837 (1985), JP-A-60-190727 (1985), JP-A-62-253045 (1987), JP-A-59-30848 (1984), JP-A-63-35681 (1988), are for protecting surface of a body from water, oil, and grease, and objects of the protection are anti-contamination, lubrication, and corrosion resistance etc. In a case of anti-contamination, when water, oil, and grease adhere to the surface, removal of the water and the oil is facilitated by forming a water repellent and oil repellent compound layer on the surface, and contamination of the surface is prevented. Besides, for lubrication, a water repellent and oil repellent compound layer is formed on the surface for preventing sticking of rubbing surface with other's surface. That means, the prior arts regard water, oil, and grease as materials which externally effect undesirable influence to whole surface of a body or the body itself, and anti-contamination, lubrication, and corrosion resistance are realized by previously forming a water repellent and oil repellent compound layer on the whole surface which contacts with water, oil, and grease.

The prior art disclosed in JP-A-59-126109 (1984) regards existence of grease as inevitable, and seeping out of grease to lenses in an optical system is prevented.

But, the technique in the prior art was only applying a simple fluorinated surfactant, and accordingly, as the fluorinated surfactant applied on the flat surface was easily removed by slight rubbing, there was a problem in reliability of the fluorinated surfactant for a long time. In order to overcome the problem, steps are provided to the place where the fluorinated surfactant is applied so as to make the fluorinated surfactant remains on the surface. But, the prior art improving the surface by the fluorinated surfactant can not be applied to flat surface.

SUMMARY OF THE INVENTION (1) Object of the invention

Object of the present invention is to provide a method, when a surface necessitating existence of water, oil, and grease, and a surface being prohibited from existence of water, oil and grease, are adjacently located on a same surface, for enclosing water, oil, and grease, onto the surface necessitating existence of water, oil, and grease for a long time in order to prevent water, oil, and grease from seeping out to the surface being prohibited from existence of water, oil, and grease.

(2) Methods solving the problems In accordance with the present invention, water, oil, and grease are enclosed onto a surface necessitating existence of water, oil, and grease by forming a water repellent and oil repellent compound layer on a surface being prohibited from existence of water, oil, and grease, and performance of the water, the oil, and the grease are maintained stable for a long time. Further, in order to enclose the water, the oil, and the grease for a long time, the present invention is featured to use a water repellent and oil repellent compound layer which is chemically fixed to the surface of a body. Besides, because of formation of the layer having a thickness of single molecule or a few molecules on the surface by chemical fixing to the surface, the present invention is applicable to any shaped surface.

Seeping out and diffusion of water, oil, and grease are caused easily as surface energy of the base plate increases. Accordingly, lowering of surface energy of the base plate is preferable for preventing seeping out and diffusion of water, oil, and grease. Fluorine has a characteristics of low friction, water repelling, and oil repelling on account of its low surface energy. Accordingly, as the surface modified by fluorinated compound is changed to have low surface energy, seeping out and diffusion of water, oil, and grease are considered to be stopped at the modified surface. By modifying circumference of a surface portion existing water, oil, and grease, by a fluorinated compound, water, oil, and grease are enclosed in the surface portion, and water, oil, and grease are able to maintain stable performance for a long time.

Technical issues in surface modification by fluorinated compound are the modification method must be easily applicable to various shaped surface and how tightly the fluorinated compound is fixed to the surface. In accordance with a method which is proposed in the prior art to apply fluorine resin on the surface, it is difficult to apply the resin uniformly on the surface having a complex shape. Further, even if the application of the resin is performed uniformly, the resin film has a thick thickness and it becomes impossible to make use sufficiently of the surface's characteristics which must naturally be functioned by the applied surface. Further, when fluorinated compound having no fixing ability is simply applied to surface of the base plate, there are possibility to be easily peeled off from the surface by washing and heat cycles etc.

In accordance with the present invention, surface of a body can be modified with fluorinated compound which is able to be applied to the surface of complex shape and to be tightly fixed to the surface without losing characteristics of the modified surface portion.

The above described object of the present invention is realized by applying an organic compound having a terminal group which is chemically reactive with surface of the body in absence of a component containing liquid water and/or liquid oil and water-oil repellent atomic groups to other surface region of the body than a surface region which bears the component containing liquid water and/or liquid oil in order to combine the organic compound to the surface of the body by chemical reaction and to form a layer of the organic compound at a position where the atomic groups and water and/or oil in the component are able to repel each other. In the above described method, a compound containing an organic group having oxysilane group as the terminal group is effective. Among various organic compounds, an organic group containing at least two fluorine atoms as the atomic group is effective, and especially, the perfluorooxyalkyl group as the atomic group is preferable.

In the above described method of treatment, the component may be grease, lubrication oil, or heat conductive compound.

The present invention also provides a surface treatment agent for forming a compound layer on surface of a body having a region which bears a component containing liquid water and/or liquid oil, characterized in including an organic compound having a terminal group which is chemically reactive with surface of the treated body and water-oil repellent atomic groups as an effective component, and forming the compound layer in which the atomic group and water and/or oil in the component are mutually repellent each other.

In accordance with the present invention, a composite body including a metallic base body having a region which bears a component containing liquid oil, and a layer of a compound having a terminal group combining chemically to the surface of the base body and water repellent and oil repellent atomic groups, characterized in that the layer of the compound is formed in a position where the atomic groups and the liquid oil are repellent each other.

As one state of the composite body, there is a bearing structure in which the base body is composed of a rotator and a bearing means to support the rotator, and the component containing liquid water and/or liquid oil is lubrication oil.

As one of applications of the present invention, there is a semiconductor device characterized in comprising a semiconductor chip, a base body bearing the semiconductor chip, a package means to insulate the semiconductor chip from outside, a heat transferring means for taking heat generated in the semiconductor chip out to outside of the package means, and heat conductive lubricant composition existing between the heat transferring means and the base body, and that a compound layer having a terminal group which chemically combines with surface of the base body and/or the heat transferring means and a water repellent and oil repellent atomic group is formed around the heat conductive lubricant composition in a manner that the atomic group and the heat conductive lubricant composition are repellent each other.

Figure 1:
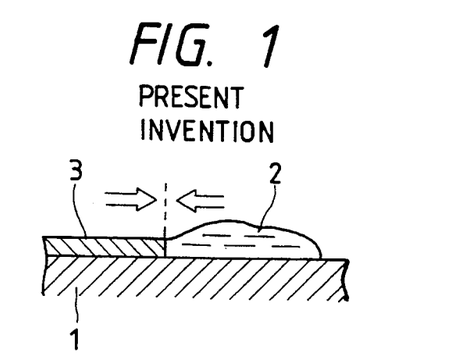
FIG. 1 is a schematic drawing for explanation of diffusion preventing mechanism of oil etc. by surface reforming with a fluorinated compound.

FIG. 1 is a cross section illustrating a member of which surface is treated by the method of the present invention, and the layer 3 of water repellent and oil repellent compound is formed on surface of the metallic or the ceramic base 1. The layer of the compound chemically combines with the base body so as not to be easily peeled off and not to be easily transferred. On the other hand, the component 2 such as grease, lubrication oil, and compound etc. containing water and/or oil is applied on surface of the base body, and the component and the compound layer 3 are formed in a position where the component and the compound layer are repellent each other. In this case, water or oil in the component 2 is unable to move outside the region on account of effect of the water repellent and oil repellent atomic group in the compound layer.

In accordance with the present invention, movement of water and/or oil on surface of the body can be prevented by forming the water repellent and oil repellent compound layer which is chemically fixed on the surface of the body.

For prevention of movement of water and/or oil, fluorinated compound layer which is chemically fixed on surface of the body is preferable.

For preventing water and/or oil from moving to surface where existence of water and/or oil is prohibited from surface where existence of water and/or oil is indispensable, both of the surface coexist on the same body, a water repellent and oil repellent compound layer which is chemically fixed on the surface where water and/or oil must not exist is formed.

When surface where existence of water, and/or oil, and/or grease is prohibited and surface where existence of water, and/or oil, and/or grease is indispensable coexist on a member using water, and/or oil, and/or grease, for preventing water, and/or oil, and/or grease from moving to the surface where existence of water, and/or oil, and/or grease is prohibited from the surface where existence of water, and/or oil, and/or Grease is indispensable, a water repellent and oil repellent compound layer which is chemically fixed on the surface where existence of water and/or oil, and/or Grease is prohibited is formed.

The fluorinated compounds which are usable as surface treatment agents in the present invention are those which are tightly fixed to surface of the base body by chemical reactions- As for the fluorinated compounds which are chemically fixed to the surface are compounds in which a reactive Group combines with perfluoropolyoxyalkyl Group or perfluoropolyoxyalkylene group. For example, the following groups can be enumerated:

$$\{Rf\}x-R_1(-Si-O-R_2) \qquad (1)$$

$$\{Rf\}x-R_3-NCO \qquad (2)$$

(3)

$$\{Rf\}x-R_5-COOH \qquad (4)$$

In which, Rf is perfluoropolyoxyalkyl group or perfluoropolyoxyalkylene group, $R_1$, $R_3$, $R_4$, $R_5$ are bivalent group, $R_2$ is any of $-CH_3$, $-C_2H_5$, $-OH$, $-OCH_3$, $-OC_2H_5$.

Other fluorinated compounds are compounds in which an organic group combines with perfluoropolyoxyalkyl group or perfluoropolyoxyalkylene group as follows:

$$\{Rf\}x-R_6-R_7-Si-(-O-R_8)_3 \qquad (5)$$

Rf: perfluoropolyoxyalkyl group, perfluoropolyoxyalkylene group, $R_6$: amide bond, ester bond, methyl ether bond, $R_7$: alkylene group, amino substituted alkylene group, aromatic substituted alkylene group, Si: silicon, $R_8$: H, $CH_3$, $C_2H_5$.

The surface treatment agent includes at least 0.05% by volume (preferably in a range 0.1~10% by volume) of the fluorine group compounds expressed by the above described general formulas. By the content more than 0.05% by volume of the fluorine group compounds, separation and seeping out of oil in grease can be prevented. The content more than 10% by volume does not cause any harm to the effect but only economical disadvantage.

The above described compounds are dissolved in a solvent, and applied around contacting portion with grease on surface of a structural body and a cooling portion, and the reactive group is combined with the surface by heating over 100° C. As for methods of the applying a method of applying with a brush, a method to immerse the body to be applied into a vessel filled with the surface treatment agent, and so on are usable. The surface and the reactive group are chemically combined. In case of simple application, the agent adheres to the surface only by surface tension etc., and there is a possibility to be easily peeled off by washing and heat cycles etc. Consequently, by chemical combination of the present invention, the fluorinated compound adheres more tightly to the surface than the case of simple application, and preferable stability can certainly be maintained. In any methods of application, extremely thin thickness of the compound layer is sufficient, and utmost 1 μm, especially utmost 0.1 μm is sufficient. In a case when only an ordinary compound is applied, average thickness of 0.1 nm to 100 nm is sufficient.

DETAILED DESCRIPTION OF THE EMBODIMENTS

Embodiment 1

Figure 2:
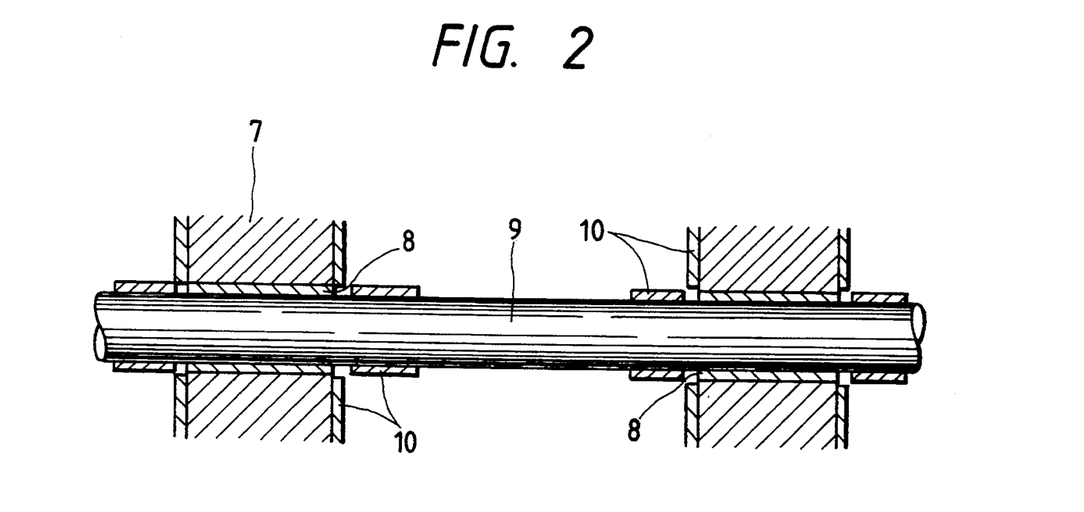
FIG. 2 is a cross section indicating structure of the bearing portion in the embodiment 1.

FIG. 2 shows a cross section of a journal bearing using grease. The grease 8 is filled between the bearing portion 7 and the shaft 9. The grease is made by integration of a solid portion and liquid portion, and the liquid portion is supported by surface tension with the solid portion. By high speed rotation or heavy loading of the shaft, the bearing portion becomes high temperature, and liquid portion of the grease changes to low molecular compound and seeps out to surroundings. Consequently, penetration of the grease is lowered, and there is a possibility that the bearing portion causes seizing because the grease does not spread on whole surface of the bearing. Accordingly, surface arrounding the bearing portion where the grease is filled and the shaft is reformed with the following fluorinated compound 10:

$$Rf—CONH—Si—(—OC_2H_5)_3 \qquad (6)$$

In which, Rf is perfluoropolyoxyalkyl group.

The above described fluorinated compound was dissolved in trichlorotrifluoroethane (Commercial name: Flon solvent S-3) at concentration of about 0.5% by weight and was applied to the portion to be coated with a brush, and the surface treatment was completed by heating at 120° C. for 10 minutes. Consequently, the surface, which was located adjacently to the bearing portion 1 filled with the grease 8 and was modified with the fluorinated compound, had a water repellent and oil repellent characteristics, seeping out of the grease was not generated, and the grease was tightly enclosed into the bearing portion. The bearing maintained stable operation for a long time.

Embodiment 2

Figure 3:
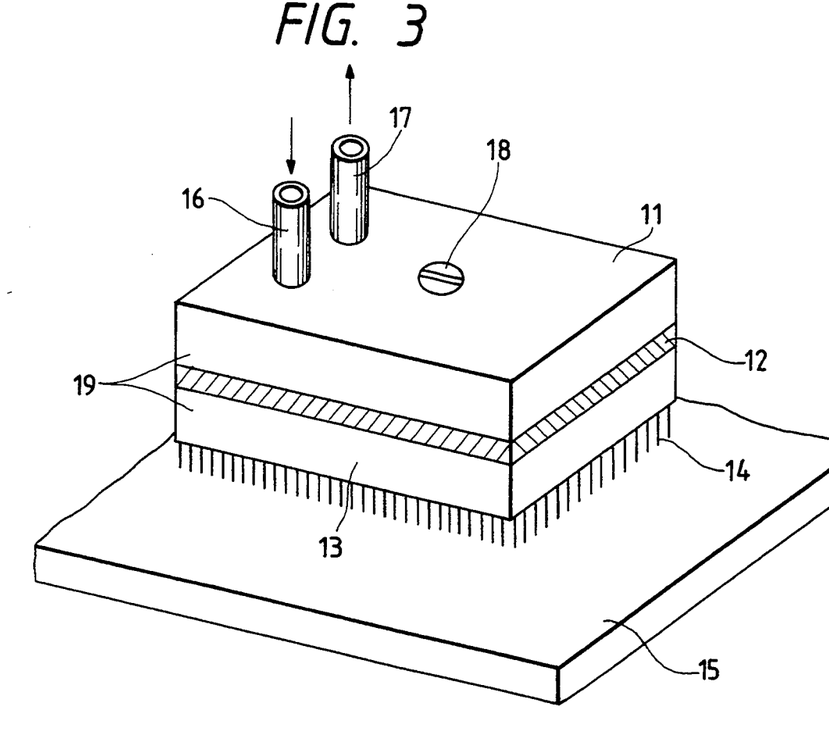
FIG. 3 is a perspective view indicating structure of the semiconductor device in the embodiment 2.
Figure 4:
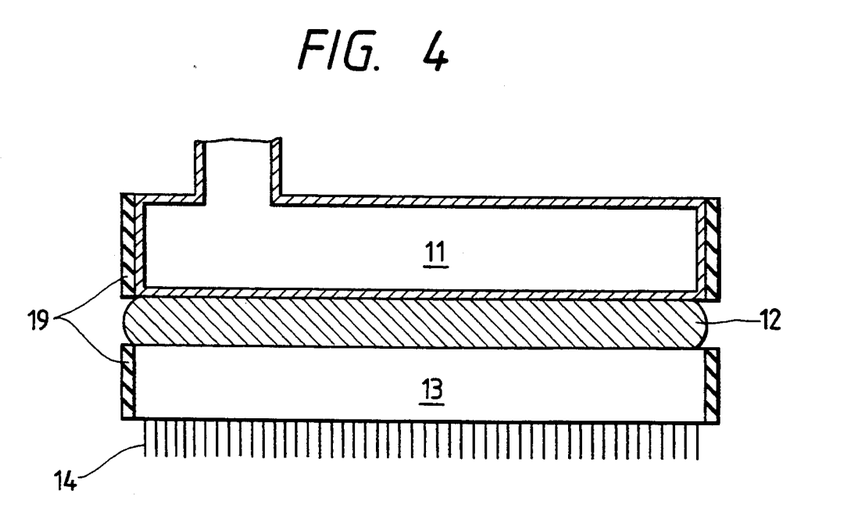
FIG. 4 is a cross section of the semiconductor device in FIG. 3.

FIG. 3 shows a perspective view of a cooling module for a large scale computer. Whole body is composed of the water cooling jacket 11, and the module 13. To the water cooling jacket 11, the inlet pipe 16 and the outlet pipe 17 for cooling water circulation are connected, and the cooling water flows through a water path which is fabricated in the water cooling Jacket 11. The water cooling jacket 11 is preferably made of copper etc. because of superior heat conductance and stable corrosion resistance against the circulating water. Besides, in view of reducing weight of the whole body, aluminum is usable. The water cooling jacket 11 contacts with the module 13 in existence of the grease 12 between, and is fixed with the fixing screw 18. The surface treatment 19 of the present invention is performed on side walls of the water cooling jacket 11 and the module 13 with a fluorine group compound. The module 13 is connected to the print substrate 5 with the pins 14. FIG. 4 illustrates a cross section of the cooling module shown in FIG. 3. The surface treatment 19 is performed on side wall of the module 13 with a fluorinated compound. The fluorinated compound used for the surface treatment was as follows:

$$Rf—CONH—C_3H_6—Si—(—OC_2H_5)_3 \qquad (7)$$

In which, Rf is perfluoropolyoxyalkyl group or perfluoropolyoxyalkylene group.

A solution in which the fluorinated compound expressed by the above described general formula was dissolved in trichlorotrifluoroethane (Commercial name: Flon solvent S-3) at concentration of at least 0.05% by weight (preferably in a range 0.1-10% by weight) was prepared. As for methods of application, the method coating with a brush, and the method in which the body to be treated is immersed into a vessel filled with the surface treatment agent is usable. After the application, The fluorinated compound was combined to the surface by heating over 100° C. If the concentration of the fluorinated compound is less than 0.05% by weight, the function to prevent separation or seeping out of oil can not be expected. On the other hand, if the concentration is more than 10% by weight, further preferable effect can not be expected and economical disadvantage is brought. The fluorinated compound, which is applied and heated in the manner described above, reacts chemically with hydroxyl group at the surface and is fixed to the surface. Consequently, seeping out of oil from the grease filled between the water cooling jacket 11 and the module 13 is completely prevented. The fluorinated compound relating to the present invention is able to be fixed more tightly and to maintain more preferable stability than the case simply applying fluorinated compound which does not have fixing group at terminal of the molecules.

Next, operation is explained. Heat generated at the module 13 is conducted to the water cooling jacket 11 through the grease 12 with low heat resistance, and subsequently, is removed by cooling water of temperature 0°-90° C. By increasing of temperature of the module 13, whole of the module 13 and the water cooling jacket 11 cause small heat deformation. The deformation is added to the grease 12 which exists at contacting portion between the module 13 and the water cooling jacket 11. Flexibility of the grease is able to accommodate the deformation, and heat conductance between the water cooling jacket 11 and the module 13 is maintained. Under the above described condition, deformation and loading are added to the grease 12, and lowering of molecular size of the liquid portion proceeds with heat in addition to the deformation and loading to be a condition facilitating separation of oil. Nevertheless, as the surface treatment 19 with the fluorinated compound was performed on the side walls of the water cooling jacket 11 and the module 13, the separated oil was unable to diffuse on the side walls of the water cooling jacket 11 and the module 13 and was enclosed in between the water cooling jacket 11 and the module 13, and accordingly, stable heat conductance and preferable accommodation of the heat deformation of the module 13 was maintained.

Embodiment 3

Figure 5:
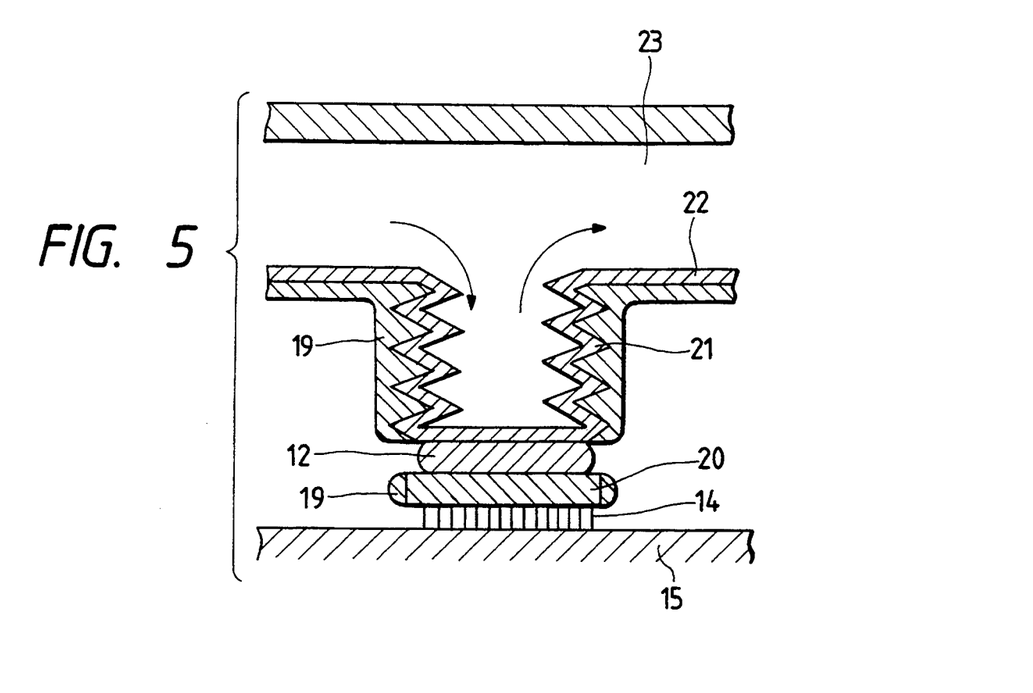
FIG. 5 is a vertical cross section indicating structure of the semiconductor device in the embodiment 3.

Referring to FIG. 5, a cooling portion of a large scale computer is schematically illustrated. In the cooling portion of the large scale computer, the bellow 21 is attached to the cooling water head 22, and the cooling water head 22 contacts tightly by pressure in the bellow 21 with surface of the chip 20 connected to the substrate 15 by the pins 14. On the contacting surface, the grease 12 is applied. The surface treatment 19 with the fluorinated compound is performed on side walls of the bellow 21 and the chip 20. The fluorinated compound used in the surface treatment was as follows:

$$Rf—COOC_2H_4—Si—(—OCH_3)_3 \qquad (8)$$

In which, Rf is perfluoropolyoxyalkyl group or perfluoropolyoxyalkylene group.

A solution of the fluorinated compound expressed by the above described general formula was prepared by dissolving the compound into trichlorotrifluoro ethane (commercial name: Flon solvent S-3) at concentration of at least 0.05% by weight (preferably in a range of 0.1–10% by weight), and was applied in the same manner as the embodiment 2. The surface treatment was completed by heating.

In accordance with the present invention, seeping out of oil from the grease 12 having heavy loading at contacting surface is not generated because of the surface treatment 19 with the fluorinated compound performed on side walls of the bellow 21 and the chip 20, and the grease 12 is enclosed in between the bellow 21 and the chip 20. Accordingly, lowering of penetration of the grease 12 caused by seeping out of oil is prevented and flexibility is maintained. As heat conductance between the bellow 21 and the chip 20 is maintained in preferable condition, stable low heat resistance is obtained for a long time.

Embodiment 4

Figure 6:
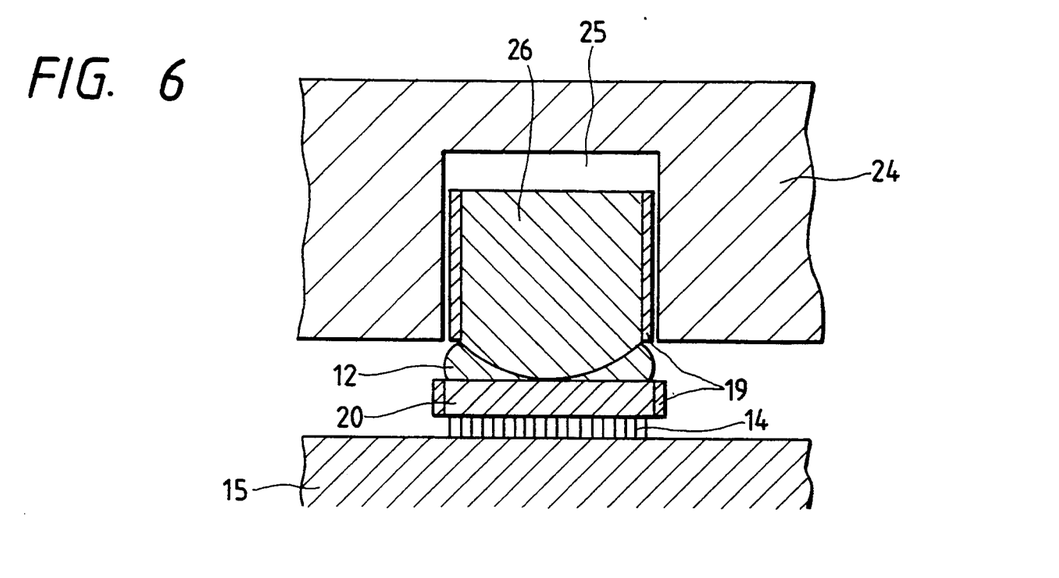
FIG. 6 is a vertical cross section indicating structure of the semiconductor device in the embodiment 4.

Referring to FIG. 6, cooling portion of a large scale computer is schematically illustrated. The piston 26 is placed in the cooling housing 24, and contacts with upper surface of the chip 20. The surface treatment 19 with the fluorinated compound is performed on side walls of the piston 26 and the chip 20. The piston 26 contacts tightly by pressure of the spring 25 with surface of the chip 20 connected to the substrate 15 by the pins 14. On the contacting surface, the grease 12 is applied. The fluorinated compound used for the surface treatment 19 was as follows:

(9)

In which, Rf is perfluoropolyoxyalkyl group or perfluoropolyoxyalkylene group.

The method of treatment is as same as the embodiments 2 and 3.

In accordance with the present invention, the grease 12 was enclosed in a contacting portion of the piston 26 with the chip 20 as same as the embodiments 2 and 3, flexibility was maintained, and heat was effectively conducted.

Embodiment 5

Figure 7:
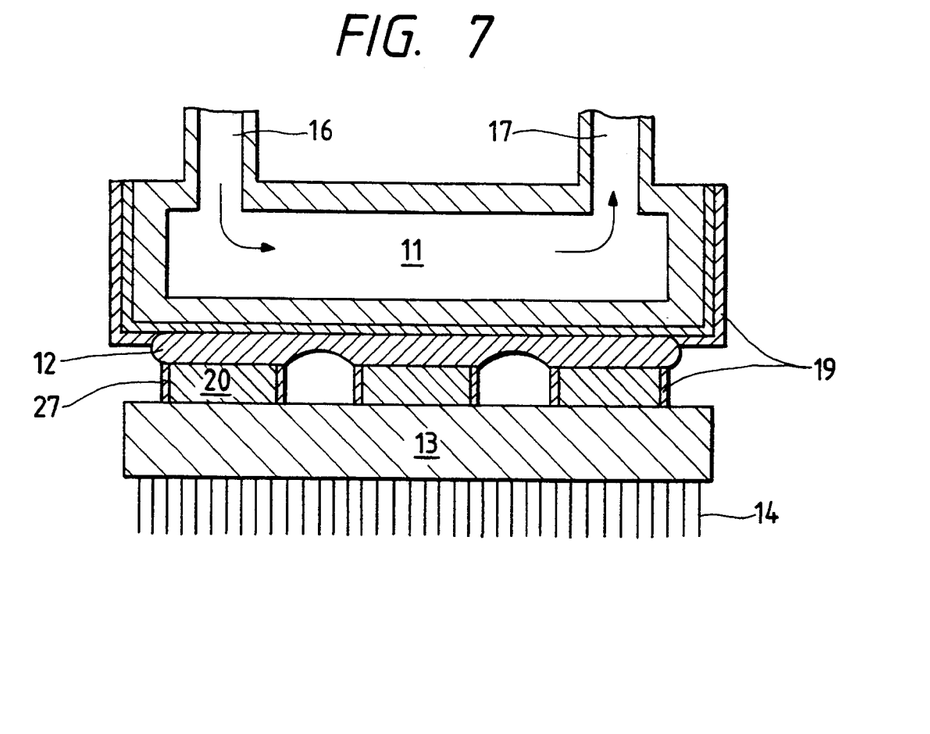
FIG. 7 is a vertical cross section indicating structure of the semiconductor device in the embodiment 5.

Referring to FIG. 7, a cross section of a cooling portion of a large scale computer is illustrated. A plurality of chips 20 are mounted on the module 13 having a extremely flat plane for mounting the chips 20. Owing to flatness of the surface of the module 13, intervals between the upper surfaces of the chips 20 and bottom plane of the water cooling Jacket 11 are almost constant. A proper quantity of the grease 12 is filled in the interval. The grease 12 contains a liquid portion having a characteristics to be gelled and to be solidified with silicone oil or a similar oxide. The surface treatment 19 with fluorinated compound is performed on side planes of the water cooling Jacket 11 and the chips 20. The fluorinated compound used in the treatment was as follows:

(10)

in which, Rf is perfluoropolyoxyalkyl group or perfluoropolyoxyalkylene group.

Method of the treatment is as same as the embodiments 2 and 3.

In accordance with the present invention, the grease 12 was enclosed in a contacting portion of the water cooling jacket 11 with the chip surface 27 as same as the embodiments 2 and 3, flexibility was maintained, and heat was effectively conducted.

Owing to the surface treatment 19 with a fluorinated compound on side walls of the chips 20, diffusion of separated oil to surface of the module 13 having a plurality of connected wires was especially able to be restrained.

COMPARATIVE EXAMPLE

Figure 8:
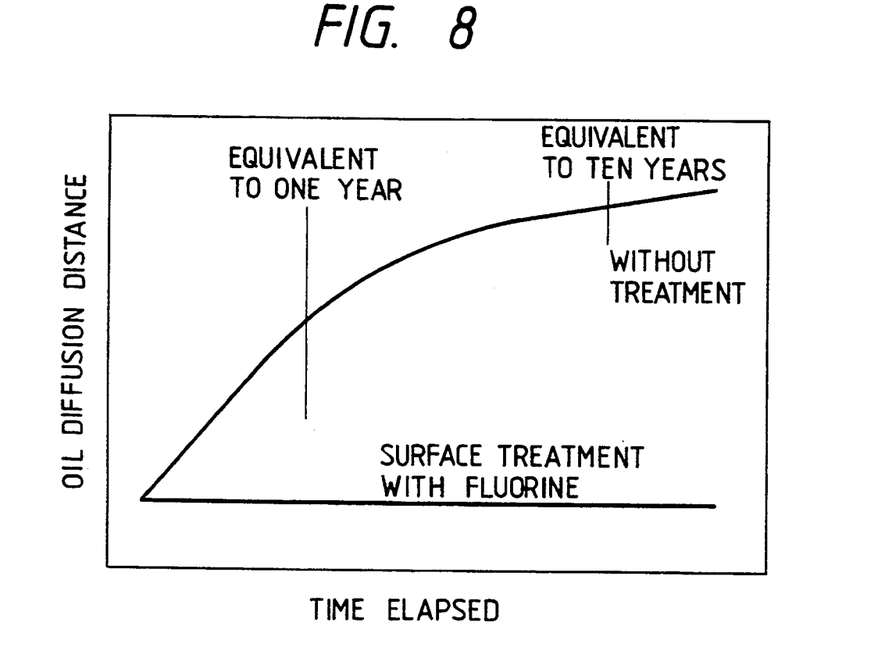
FIG. 8 is a graph showing a comparison of oil diffusion distance in the comparative example.

Referring to FIG. 8, a comparison of oil diffusion distance seeping out from the grease 12 is indicated. The oil diffusion distance means a horizontal distance seeping out of the Grease 12 from a plane where the grease is initially applied. The surface treatment with a fluorinated compound relating to the present invention has a function to prevent separation of oil and seeping out diffusion of oil. The case in which the surface treatment is not performed, oil spreads out to whole cooling structural body in a period equivalent to ten years. On the other hand, the oil diffusion is not observed at all on the cooling structural bodies in the embodiments 2, 3, 4, and 5 in which the surface treatment 19 with a fluorinated compound has been performed.

What is claimed is:

1. A semiconductor device characterized in comprising a semiconductor chip, a base body bearing the semiconductor chip, a package means for insulating said semiconductor chip from outside, a heat transferring means for taking heat generated at said semiconductor chip out to outside of said package means, and heat conductive lubricant composition existing between said heat transferring means and said base body, and that a compound layer having a terminal group which chemically combines with surface of said base body and/or said heat transferring means and a water repellent and oil repellent atomic group is formed around said heat conductive lubricant composition in a manner that said atomic group and said heat conductive lubricant composition are repellent each other.

2. A semiconductor device as claimed in claim 1, wherein said water repellent and oil repelling atomic group is an organic group containing fluorine atom.

3. A semiconductor device as claimed in claim 1, wherein said heat conductive lubricant composition is a compound containing oil, thickening agent, and inorganic filler.

4. A semiconductor device as claimed in claim 1, wherein said terminal Group which chemically combines with surface of said base body is an organic Group having oxysilane Group.

5. A semiconductor device as claimed in claim 1, wherein said heat transferring means and package are composed of ceramics.

6. A semiconductor device which comprises a semiconductor chip, a base body bearing the semiconductor chip, a heat transferring means for taking heat generated at said semiconductor chip away from said chip, a heat conductive lubricant composition arranged between said heat transferring means and said chip and a layer of a compound having a terminal group which chemically combines with a surface of said base body and/or a surface of said heat transferring means and a water repellant and oil repellent atomic group, formed around a circumference of said heat conductive lubricant composition whereby said atomic group and said heat conductive lubricant composition are able to repel each other and diffusion of said heat lubricant composition from between said heat transferring means and said chip is prevented.

7. A semiconductor device as claimed in claim 6, wherein said water repellent and oil repellent atomic group is an organic group containing a fluorine atom.

8. A semiconductor device as claimed in claim 7, wherein said terminal group which chemically combines with the surface of said base body is an organic group having an oxysilane group.

9. A semiconductor device as claimed in claim 5, wherein said heat conductive lubricant composition comprises a lubricating oil, a thickening agent and an inorganic filler.

* * * * *